United States Patent [19]

Honda et al.

[11] Patent Number: 5,543,760
[45] Date of Patent: Aug. 6, 1996

[54] PROTECTION CIRCUIT FOR A POWER AMPLIFIER

[75] Inventors: Jun Honda; Kunihiro Miyata, both of Tokyo, Japan

[73] Assignee: Pioneer Electronic Corporation, Tokyo, Japan

[21] Appl. No.: 205,397

[22] Filed: Mar. 3, 1994

[30] Foreign Application Priority Data

Mar. 5, 1993 [JP] Japan .................................. 5-070846

[51] Int. Cl.⁶ ..................................................... H03F 1/52
[52] U.S. Cl. ....................................... 330/298; 330/207 P
[58] Field of Search ................................ 330/207 P, 298; 361/86, 87, 104; 381/55

[56] References Cited

FOREIGN PATENT DOCUMENTS 3345703  6/1985  Germany ................................ 330/298

Primary Examiner—James B. Mullins
Attorney, Agent, or Firm—Nikaido, Marmelstein, Murray & Oram LLP

[57] ABSTRACT

A direct current voltages detecting circuit is provided for monitoring output voltage of the power amplifier. A direct current signal is produced when a direct current voltage is detected. A cutoff circuit responds to the direct current signal and renders an output stage of the power amplifier a cutoff state. A failure determining circuit is provided to respond to the direct current signal and to produce an abnormality signal. In response to the abnormality signal, a power supply cutoff circuit operates to cutoff a power supply of the power amplifier.

10 Claims, 9 Drawing Sheets

PROTECTION CIRCUIT FOR A POWER AMPLIFIER

BACKGROUND OF THE INVENTION

The present invention relates to a power amplifier, and more particularly to a protection circuit provided therein.

The power amplifier is generally provided with a speaker protection circuit for protecting loudspeakers and with an amplifier protection circuit for protecting the power amplifier itself, in case of malfunction. A typical speaker protection circuit has a speaker protective relay provided between the output terminal of the power amplifier and the loudspeaker. Upon generation of a DC voltage at the output terminal of the power amplifier, contacts of the relay are opened, thereby cutting off the connection between the amplifier and the speaker. However, the relays are costly, and moreover, cause the sound quality to decrease.

The amplifier protection circuit has a detecting means for detecting abnormalities of supply voltages at various stages of the power amplifier. The amplifier protection circuit comprises a relay or a fuse provided at the primary side of the power transformer. The contacts of the relay are opened when an abnormality is detected. Alternatively, the fuse is melted by an abnormal current to shut off the power supply circuit. A plurality of fuses for respective essential circuits are further provided at the secondary side of the transformer. Since the primary side fuse is set so as not to melt when the power amplifier generates an output of the rated output, the primary side fuse does not melt when an abnormality in an auxiliary circuit such as a voltage amplifier occurs. Therefore the secondary side fuses are provided to protect each circuit of the auxiliary circuit.

These fuses renders the construction of the circuit complicated and hence increases cost.

SUMMARY OF THE INVENTION

An object of the present invention is to provide a speaker protection circuit without a speaker protective relay.

Another object of the present invention is to provide an amplifier protection circuit wherein fuses for protecting various circuits in the power amplifier are obviated.

Still another object of the present invention is to provide a protection circuit for a power amplifier where a speaker protection relay and circuit protection fuses are omitted so that the number of the parts thereof is reduced, while improving the reliability of the circuit.

According to the present invention there is provided a protection circuit for a power amplifier comprising direct current voltage detecting circuit means for monitoring output voltage of the power amplifier and for producing a direct current signal when a direct current voltage is detected, cutoff circuit means responsive to the direct current signal for rendering an output stage of the power amplifier a cutoff state, failure determining circuit means responsive to the direct current signal for producing an abnormality signal, a power supply cutoff circuit responsive to the abnormality signal for cutting off a power supply of the power amplifier.

The present invention further provides a protection circuit for a power amplifier comprising, supply voltage monitoring circuit means for monitoring supply voltage of at least one stage precedent to an output stage of the power amplifier and for producing an abnormality signal when the supply voltage is abnormal, a short-circuiting circuit responsive to the abnormality signal for short-circuiting the output stage so as to cause a large current in a power supply of the power amplifier, and a power supply cutoff circuit for cutting off the power supply by the large current.

The present invention still further provides a protection circuit for a power amplifier comprising, direct current voltage detecting circuit means for monitoring output voltage of the power amplifier and for producing a direct current signal when a direct current voltage is detected, cutoff circuit means responsive to the direct current signal for rendering an output stage of the power amplifier a cutoff stage, failure determining circuit means responsive to the direct current signal for producing a first abnormality signal, a power supply cutoff circuit responsive to the first abnormality signal for cutting off a power supply of the power amplifier, supply voltage monitoring circuit means for monitoring supply voltage of at least one stage precedent to a stage of the power amplifier and for producing a second abnormality signal when the supply voltage is abnormal, a short-circuiting circuit responsive to the second abnormality signal for short-circuiting between both sides of a circuit of the power amplifier so as to cause a large current in the power supply, and the power supply cutoff circuit being provided for cutting off the power supply by the large current.

Other objects and features of this invention will become understood from the following description with reference to the accompanying drawings.

DETAILED DESCRIPTION OF THE PREFERRED EMBODIMENTS

The embodiments of the present invention will now be described hereinafter with reference to FIGS. 1 to 7. In the figures, only the amplifiers for one of the channels in a stereo system is shown for the ease of explanation.

Figure 1:
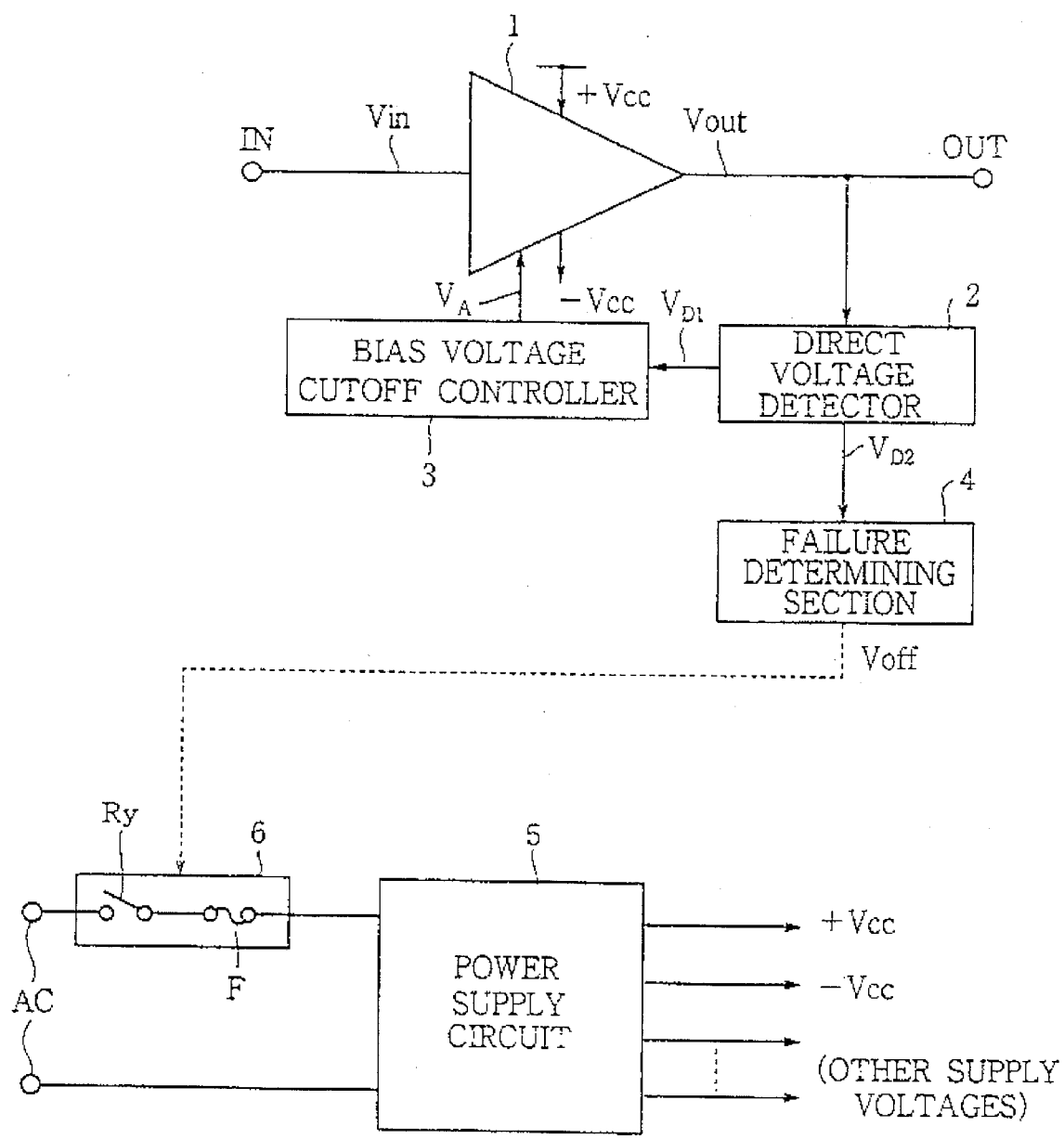
FIG. 1 is a block diagram of a protection circuit for a power amplifier according to the present invention.
Figure 2:
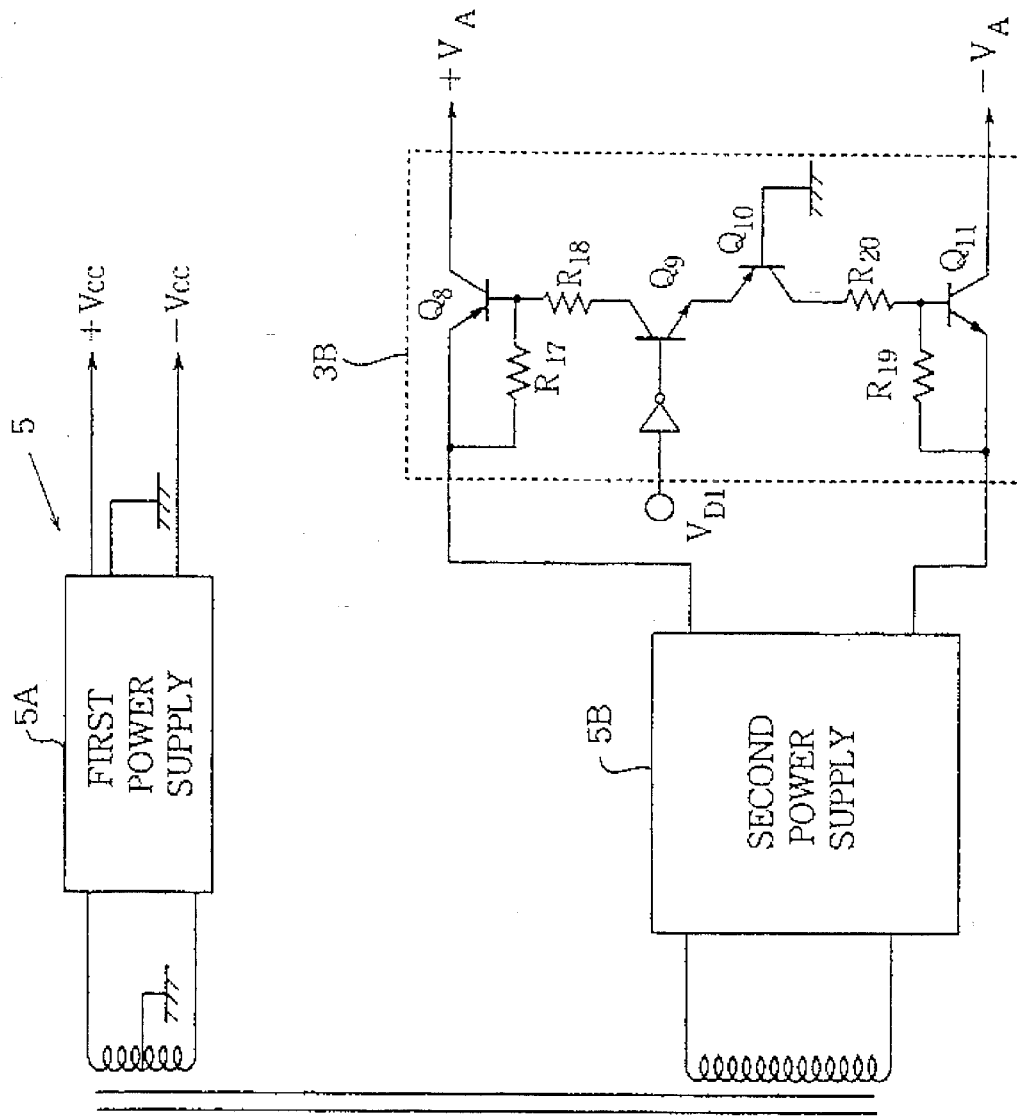
FIG. 2 is a circuit diagram showing a part of the power amplifier of FIG. 1.
Figure 2:
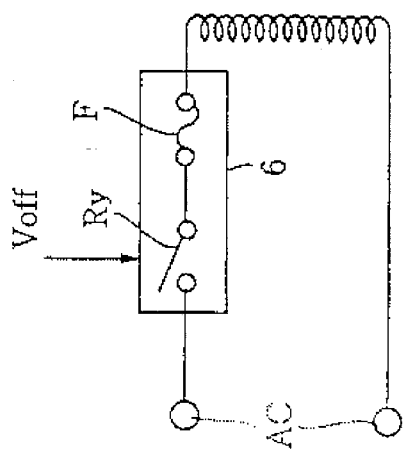

FIG. 1 describes a power amplifier of the present invention. The power amplifier has an amplifier 1 to which an input signal Vin is fed through an input terminal IN. An output signal Vout of the amplifier 1 is fed to a loudspeaker (not shown) through an output terminal OUT. The amplifier 1 is supplied with the supply voltages $+V_{CC}$ and $-V_{CC}$ from a power supply circuit 5 which receives an alternating current through a transformer (FIG. 2).

The output signal Vout is further applied to a direct voltage detector 2 which detects both the positive and negative direct current voltages included in the output signal Vout and generates a direct voltage detecting signal $V_{D1}$ and $V_{D2}$. The detecting signals $V_{D1}$ and $V_{D2}$ are applied to a bias voltage cutoff controller 3 and to a failure determining section 4, respectively.

The bias voltage cutoff controller 3 comprises a time constant circuit such as a monostable multivibrator and a cutoff circuit. In response to the direct voltage detecting signal $V_{D1}$, the cutoff controller 3 cuts off a supply of a bias voltage from the power supply circuit 5 to the amplifier 1 for a set time of the time constant, a few seconds for example. Consequently, the operation of the amplifier 1 is stopped for the predetermined time, so that a voice coil of the loudspeaker is prevented from being fed with an abnormal voltage.

The failure determining section 4 is for example, a timer comprising a CR time constant circuit. When the direct voltage detecting signal $V_{D2}$ continues to be supplied from the direct voltage detector 2 for more than a predetermined period after the amplifier 1 stops operating, for example one second, the failure determining section 4 applies a supply voltage cutoff signal $V_{off}$ to a power cutoff circuit 6. The power cutoff circuit 6 is connected to a primary winding of the transformer of the power supply circuit 5 and comprises a relay Ry and a fuse F serially connected to each other. The supply voltage cutoff signal $V_{off}$ is applied to the relay Ry to open the contact thereof. Thus, the power to the entire power amplifier is cutoff.

Figure 3:
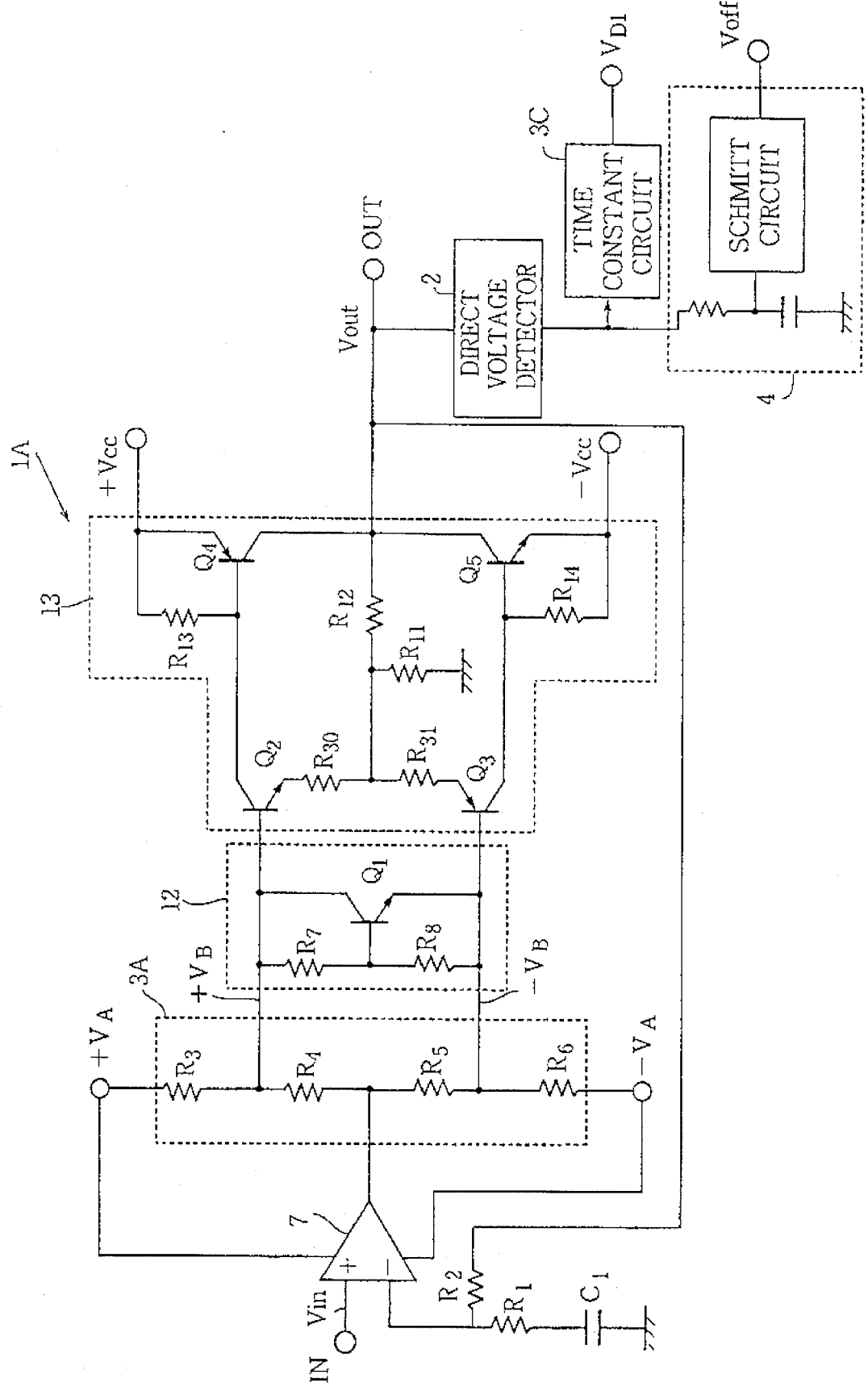
FIG. 3a is a circuit diagram showing another part of the power amplifier.
FIG. 3b shows a direct voltage detector.
Figure 3:
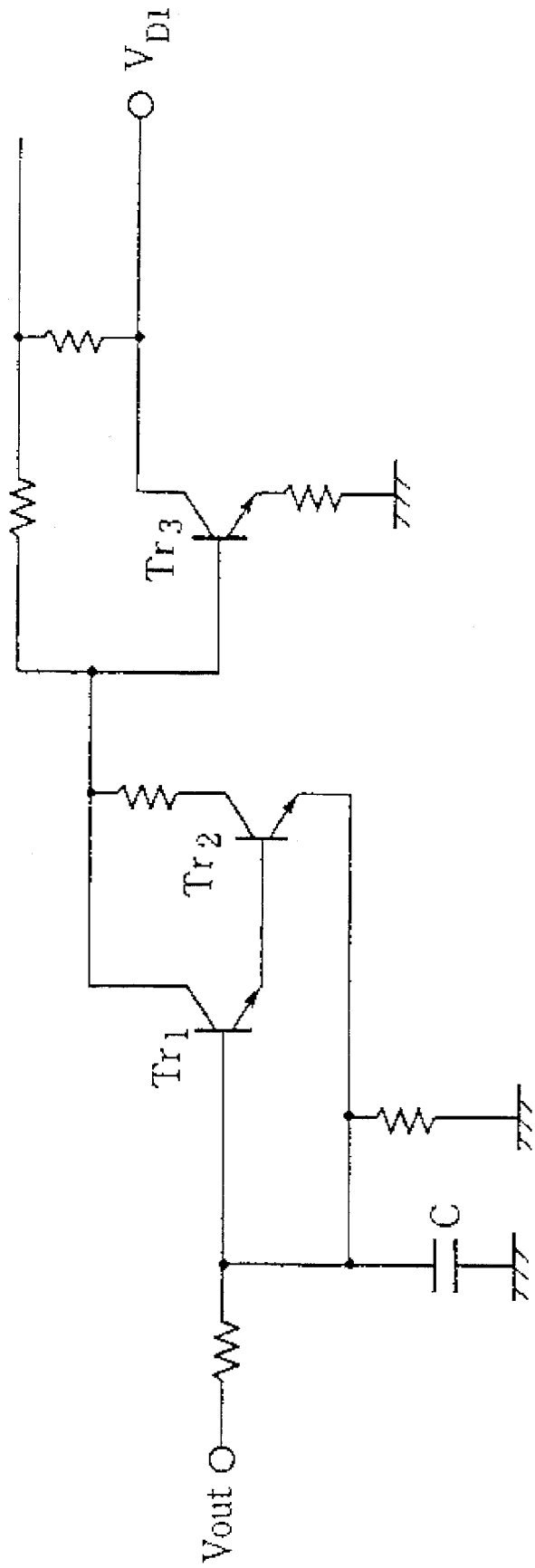

FIGS. 2 and 3 show an embodiment of the circuit of the power amplifier hereinbefore described.

Referring to FIG. 2, a power supply section 5 of the power amplifier of the present invention is electrically connected to a power switch through the transformer so as to be applied with an alternating voltage. The power cutoff circuit 6 comprising the relay Ry and fuse F is connected to the primary winding of the transformer. The power supply section 5 has a first power supply 5A for feeding voltages $+V_{CC}$ and $-V_{CC}$ to power amplifier stage 1A shown in FIG. 3. The power supply section 5 further has a second power supply 5B and a bias voltage generating circuit 3B for applying bias voltages $+V_A$ and $-V_A$ to the power amplifier.

The bias voltage generating circuit 3B comprises transistors Q8, Q9, Q10 and Q11, resistors R17, R18, R19 and R20. The base of the transistor Q9 is applied with the direct voltage detecting signal $V_{D1}$ through an inverter. The collector of the transistor Q9 is connected to the base of the transistor Q8 through the resistor R18 and the emitter thereof to the emitter of the transistor Q10, the base of which is grounded. The collector of the transistor Q10 is connected to the base of the transistor Q11 through the resistor R20. The resistor 17 is provided between the emitter and the base of the transistor Q8, the collector thereof connected to the power amplifier stage 1A to apply the bias voltage $+V_A$. The resistor 19 is provided between the base and the emitter of the transistor Q11, the collector thereof also connected to the power amplifier stage 1A to apply the bias voltage $-V_A$.

When a low level direct voltage control signal $V_{D1}$ is applied to the bias voltage generating circuit 3B, the level at the base of the transistor Q9 is high so that, the transistors Q9 and Q10 are rendered conductive. Hence the transistors Q8 and Q11 become conductive so that the current from the power supply circuit 5B is allowed to pass therethrough. The transistor Q10 is provided to set a voltage for the input terminal of the direct voltage detecting signal $V_{D1}$. The resistors R17 and R19 are provided to cut off the transistors Q8 and Q11, respectively.

Referring to FIG. 3a, the power amplifier stage 1A has a preamp 7, voltage synthesizer 3A, a temperature compensation and bias voltage setting circuit 12 and a collector output type class B push-pull amplifier stage 13. The non-inverting terminal of the preamp 7 is applied with the audio input signal Vin through the terminal IN. The inverting terminal of the preamp 7 is grounded through a resistor R1 and a capacitor C1, and further fed with a feedback signal through a resistor R2. The capacitor C1 is provided to shut off a direct voltage component of the feedback signal fed back from the push-pull amplifier 13 to the preamp 7, and to provide a 100% negative feedback of the direct voltage. The resistors R1 and R2 determine the gain of the alternating voltage in the entire circuit. The preamp 7 is further applied with the voltages $+V_A$ and $-V_A$ from the bias voltage generating circuit 3B of the power supply section 5, as a source voltage.

The output of the preamp 7 is fed to the voltage synthesizer 3A comprising resistors R3, R4, R5 and R6 connected in series. The output of the preamp 7 is fed between the resistors R4 and R5. The voltage synthesizer divides the voltages $\pm V_A$ at a predetermined ratio into bias voltages $\pm V_B$ and synthesizes the output of the preamp 7 with the bias voltage.

The temperature compensation and bias voltage setting circuit 12 comprises resistors R7 and R8 and a transistor Q1, the base of which is connected between the resistors R7 and R8.

The push-pull amplifier stage 13 comprises a driver stage having transistors Q2 and Q3, and an output stage having a pnp transistor Q4 and an npn transistor Q5. The bases of the transistors Q2 and Q3 are connected to the collector and the emitter of the transistor Q1 of the bias setting circuit 12, respectively. The collector of the transistor Q2 is connected to the base of the transistor Q4, and the emitter thereof is connected to the emitter of the transistor Q3 through resistors R30 and R31 connected in series. The collector of the transistor Q3 is connected to the base of the transistor Q5. The collector of the transistor Q4 is connected to the collector of the transistor Q5. Each of resistors R13 and R14 is connected between the emitter and the base of each of the transistors Q4 and Q5 to provide a fixed bias. The output signal of the push-pull amplifier stage 13 is fed back to the inverting terminal of the preamp 7 through the resistor R2. The resistors R11 and R12 connected between the output of the amplifier stage and the ground form a voltage dividing circuit and provide a local negative feedback to the driver stage of the push-pull amplifier stage 13, thereby setting the distributing levels between the driver stage and the output stage.

FIG. 3b shows the direct voltage detector 2. The output signal Vout of the power amplifier is fed to a base of a transistor $Tr_1$ of the direct voltage detector 2. The alternating component included in the output Vout is cut off by a capacitor R, and the direct voltage therein turns on a transistor $Tr_1$, and hence a transistor $Tr_2$. A transistor $Tr_3$ becomes OFF so that a high level direct voltage detecting signal $V_{D1}$ is produced. The signal $V_{D1}$ is fed to the bias voltage generating circuit 3B through a time constant circuit 3C for a predetermined time.

In operation, the bias voltages $+V_A$ and $-V_A$ is applied to the preamp 7 and the voltage synthesizer 3A, thereby producing the bias voltages $+V_B$ and $-V_B$. The temperature compensation and bias voltage setting circuit 12 compensates the change of output voltage due to the change of temperature of the transistors Q2 to Q5 by the change of the voltage between the emitter and the base of the transistor Q1 due to the change thereof, thereby maintaining the voltage between the bases of the transistors Q2 and Q3 constant. The supply voltages $+V_{CC}$ and $-V_{CC}$ is applied to the push-pull amplifier stage 13, so that a class B push-pull amplification is carried out. Thus the output signal Vout is fed to the terminal OUT.

When the direct voltage detector 2 detects a direct voltage in the output signal Vout, which voltage has such a high level as to cause failure of the speaker, a high level direct voltage detecting signal $V_{D1}$ is fed to the bias voltage generating circuit 3B through a time constant circuit 3C for a predetermined time(5 sec.). Accordingly, a low level signal is fed to the base of the transistor Q9, rendering it inconductive. Consequently, the bias voltage generating circuit 3B stops feeding the bias voltages $+V_A$ and $-V_A$ to the power amplifier stage 1A for the predetermined time. The driver transistors Q2 and Q3 and the output transistors Q4 and Q5 in the push-pull amplifier stage 13 become inconductive, thereby cutting off the supply of the output signal Vout to the voice coil of the loudspeaker. Hence the speaker is protected.

If the output signal Vout including the direct voltage is still fed for more than one second after the bias voltage is cutoff, the failure determining section 4 having a CR circuit and a Schmitt circuit applies the supply voltage cutoff signal Voff to the relay Ry of the power cutoff circuit 6. As a result, the power to the power amplifier is cut off, thereby protecting the power amplifier.

Referring to FIG. 4a, the power amplifier of the second embodiment of the present invention is provided with a supply voltage monitoring circuit 8 to which various supply voltages $V_{D4}$, for representing supply voltages at various stages precedent to the output transistors of the power amplifier. Supply voltages $+V_{CC}$ and $-V_{CC}$ for operating the output transistors of the power amplifier 1 is excluded from these voltages $V_{D4}$. When there is an abnormality in one of the supply voltages $V_{D4}$, such as when the voltage becomes zero, the supply voltage monitoring circuit 8 applies an abnormality signal $V_{D3}$ to a forcibly short-circuiting circuit 9.

Various known circuits can be applied to the supply voltage monitoring circuit 8. FIG. 4b shows an example of the monitoring circuit 8. When one or more $V_{D4}$ becomes zero, at least one transistor Tr becomes non-conductive. Thus, a transistor $Tr_4$ become conductive, thereby producing the abnormality signal $V_{D3}$ is decreased. The abnormality signal $V_{D3}$ is fed to the short-circuiting circuit 9.

The forcibly short-circuiting circuit 9, in response to the abnormality signal $V_{D3}$, applies a short-circuiting signal Vs to the amplifier 1, thereby rendering conductive both output transistors provided in the amplifier 1 at the same time. Thus, the output circuit of the amplifier 1 is short-circuited, so that the supply voltage $V_{CC}$ is increased, exceeding the rated output. Hence the fuse F of the power cutoff circuit 6 is melted, thereby stopping the supply of power.

Figure 5:
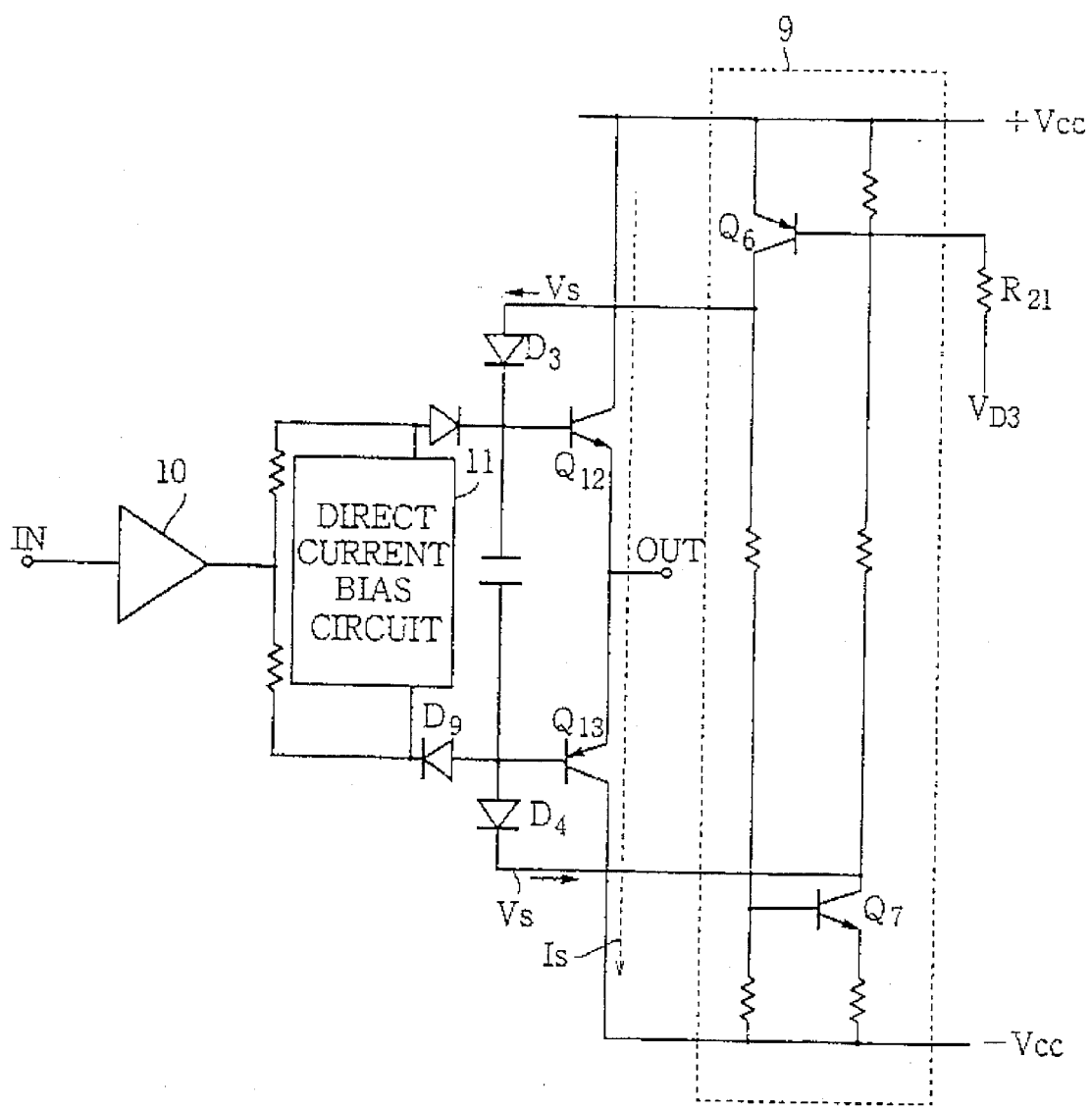
FIG. 5 is a circuit diagram showing a part of an example of the protection circuit of FIG. 4.

FIG. 5 shows an example of a circuit of the second embodiment of the present invention applied to an emitter follower push-pull amplifier.

The push-pull amplifier has a pre-amplifier 10, a direct current bias circuit 11 parallelly connected to the amplifier 10, and a pair of output transistors Q12 and Q13 connected to the amplifier 10. The bases of the transistors Q12 and Q13 are connected to each other through a capacitor, and the emitters thereof are connected to the output terminal OUT. The collectors are connected to the power supply circuit so as to be supplied with the voltages $+V_{CC}$ and $-V_{CC}$.

The forcibly short-circuiting circuit 9 in the present example comprises a pair of thyristor-connection transistors Q6 and Q7 provided between the collectors of the transistors Q12 and Q13. The base of the transistors Q6 is connected to the supply voltage monitoring circuit 8 through a resistor R21. The emitter of the transistor Q6 is connected to the voltage supply and the collector is connected to the base of the transistor Q7. The emitter of the transistor Q7 is connected to the voltage supply. The collector of the transistor Q6 is further connected to the base of the transistor Q12 through a diode D3 and the collector of the transistor Q7 is connected to the base of the transistor Q13 through a diode D4.

When the abnormality signal $V_{D3}$, which has a ground or a negative potential, from the supply voltage monitoring circuit 8 is fed to the base of the transistor Q6 through the resistor R21, the transistor Q6 and the transistor Q7 become conductive. The base of the transistor Q12 is applied with the transistor driving signal Vs based on the supply voltage $+V_{CC}$ through the diode D3, so that the transistor Q12 becomes conductive.

Figure 4:
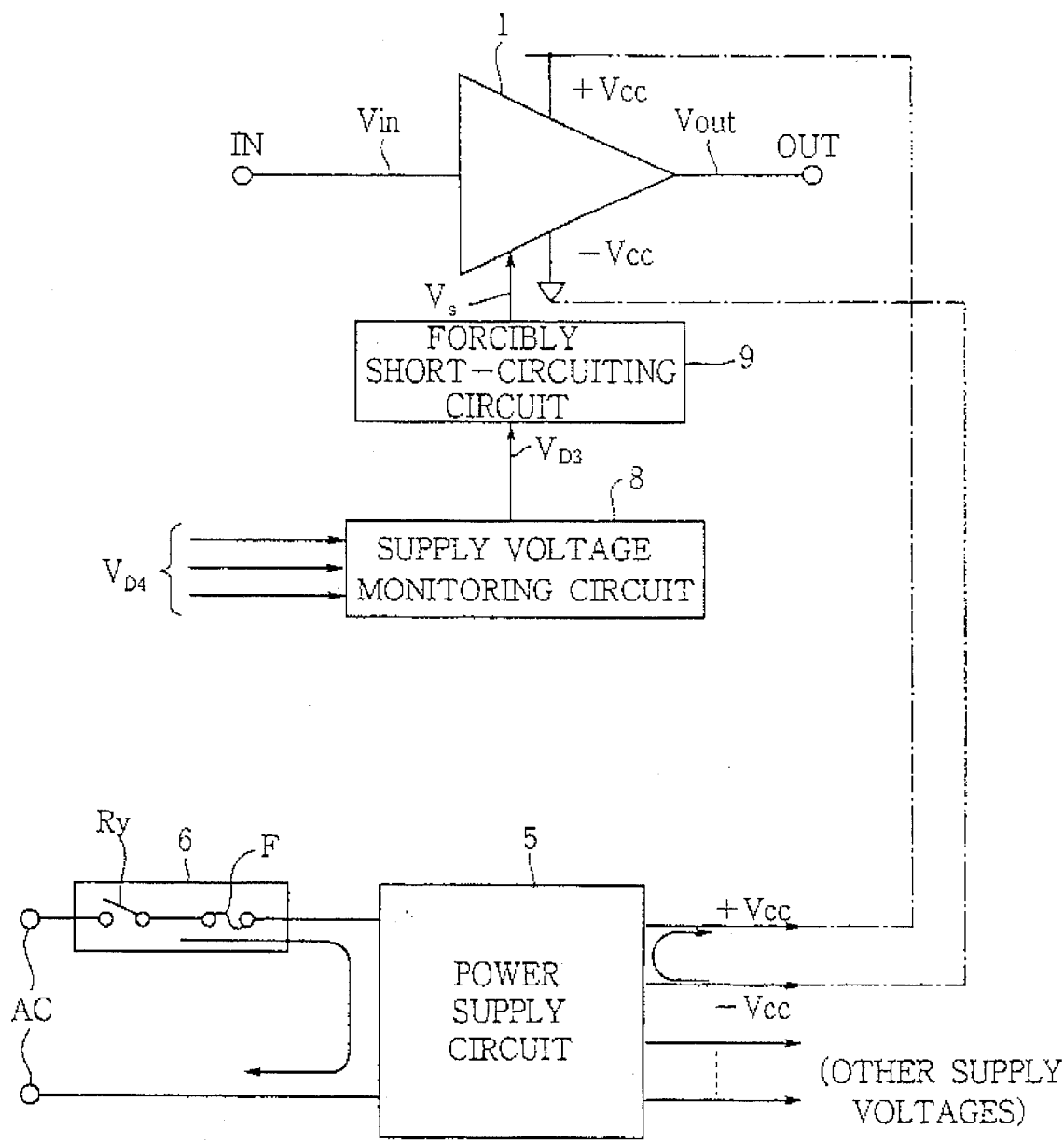
FIG. 4a is a block diagram of a protection circuit for a power amplifier of a second embodiment of the present invention.
FIG. 4b shows a supply voltage monitoring circuit.
Figure 4:
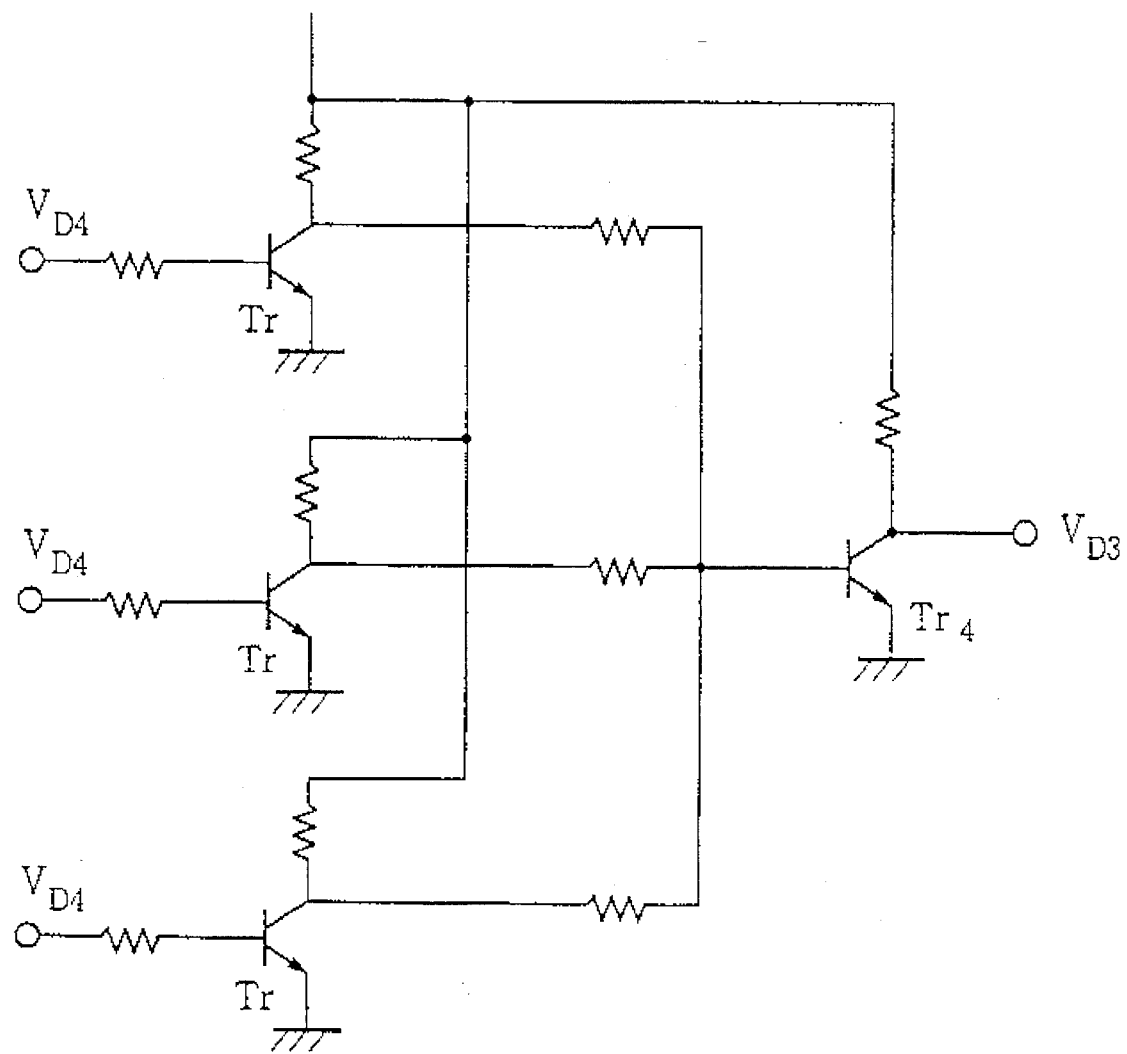

The base of the transistor Q13 is applied with a driving signal Vs through the diode D4, so that the transistor Q13 becomes conductive. Hence a through current Is flows through the transistors Q12 and Q13 as shown by a dashed line. Since the through current Is is a short-circuit current, a large current flows at the primary side of the power supply circuit 5, so that the fuse F of the power cutoff circuit 6 shown in FIG. 4 is melted to cut off the supply voltages $+V_{CC}$ and $-V_{CC}$.

In the second embodiment of the present invention, when there is an abnormality in supply voltages for operating various stages preceding the output transistors of the power amplifier, even an abnormality in a small voltage supply intentionally causes a large current to flow through the output transistors, resulting in a melting of the fuse provided in the primary side the power supply circuit. Hence, it is unnecessary to provide a multiple of fuses which are installed in the secondary side the power supply circuit in the conventional protection circuit.

Figure 6:
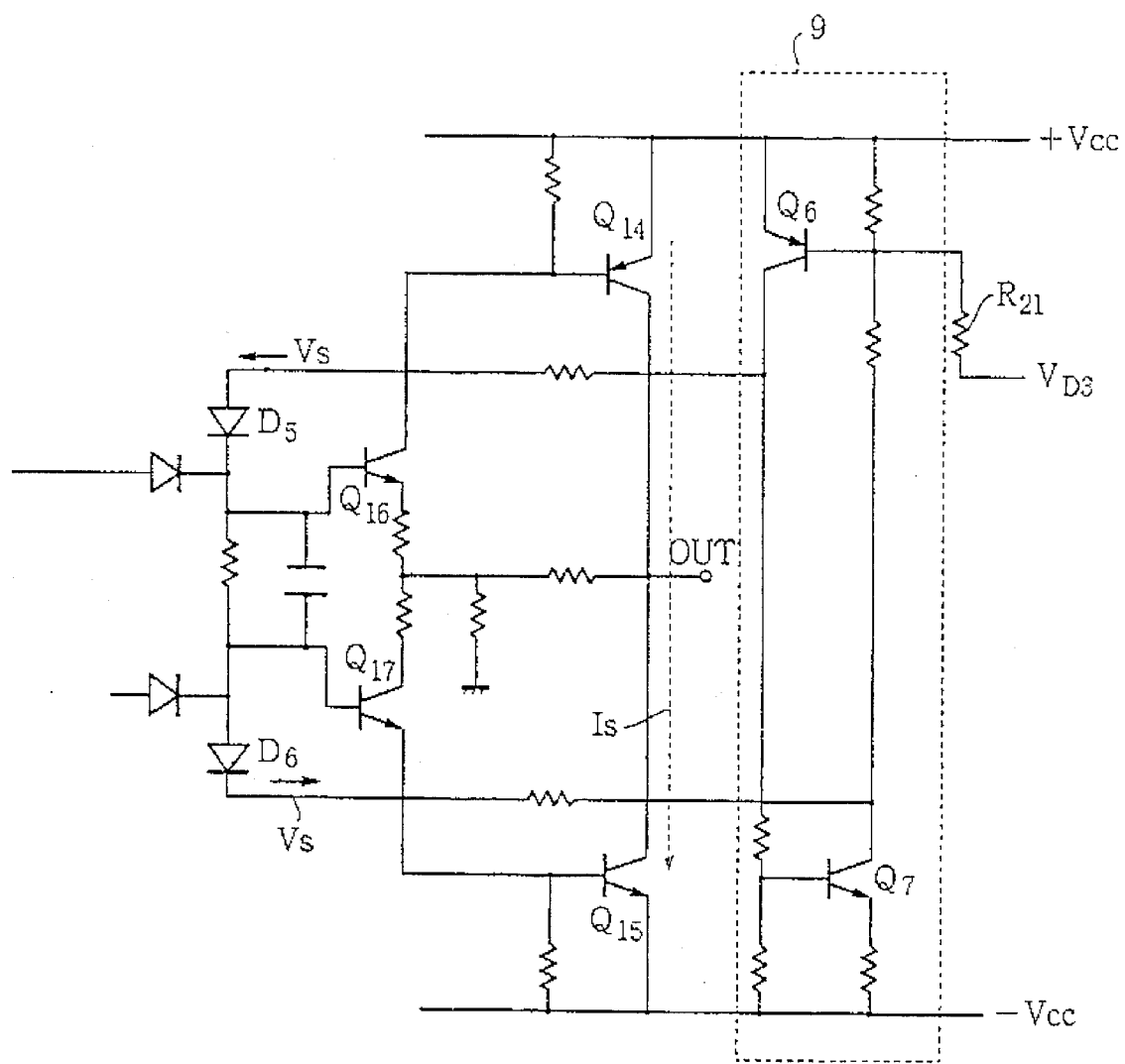
FIG. 6 is a circuit diagram showing another example of the protection circuit.

Referring to FIG. 6 showing another example of the second embodiment, the amplifier 1 has an output stage comprising a collector output type transistors Q14 and Q15. The short-circuiting circuit 9 is constructed in the same manner as that of FIG. 5. The transistor driving signal Vs is applied to the bases of drive transistors Q16 and Q17 through a diode D5, and further to the collector of the transistor Q7 through a diode D6. The through current flows through the output transistors Q14 and Q15 thereby increasing the supply voltage $V_{CC}$, causing the fuse to melt.

Figure 7:
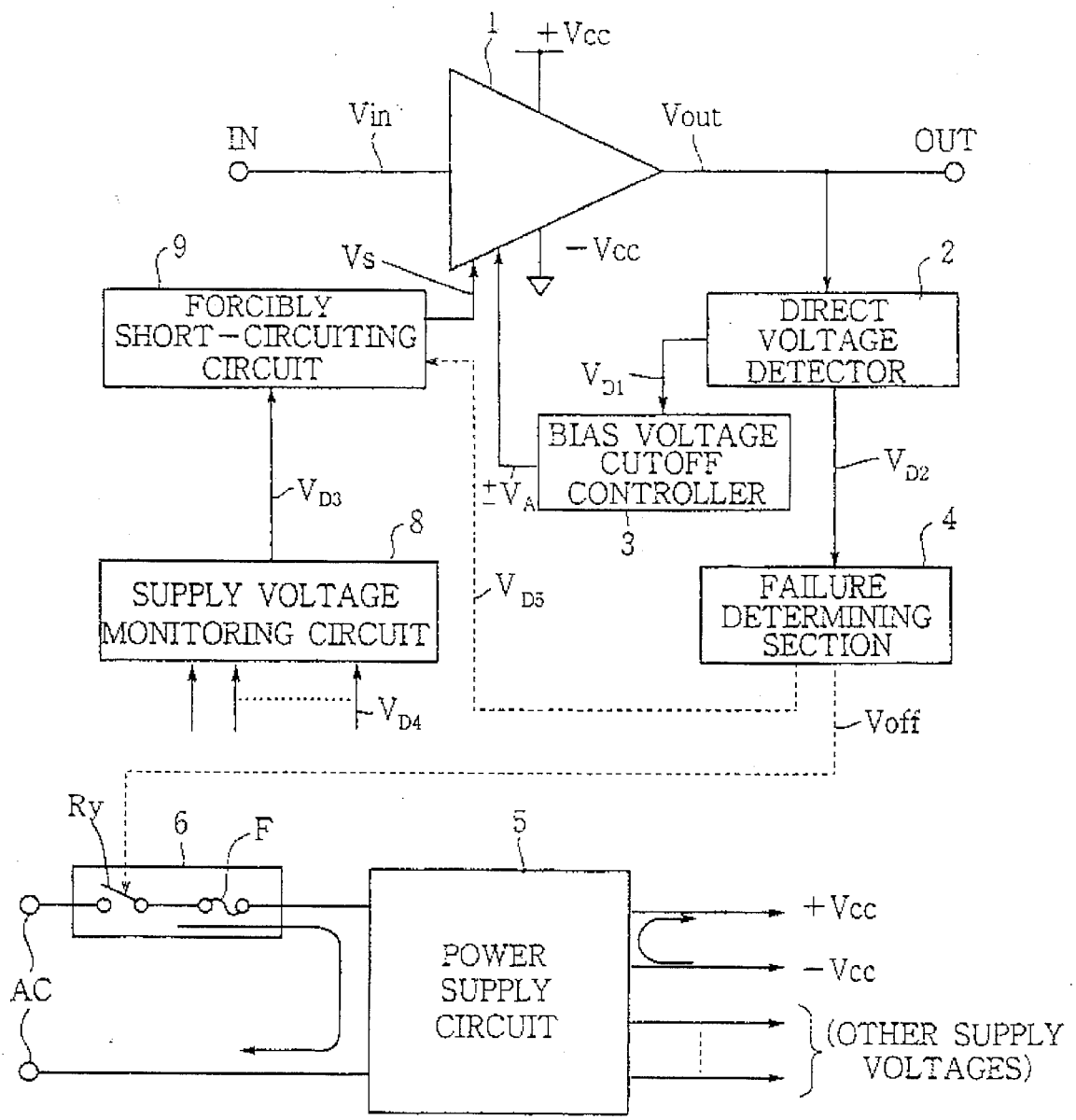
FIG. 7 is a block diagram of a protection circuit of a third embodiment of the present invention.

FIG. 7 shows a third embodiment of the present invention where the first and second embodiments are combined. The same numerals as those in FIGS. 1 and 4 designate the same parts in FIG. 7 so that further description thereof is obviated.

One of the most marked features of the third embodiment is that a first protection circuit comprising the direct voltage detector 2, cutoff controller 3 and the failure determining section 4, and a second protection circuit comprising supply voltage monitoring circuit 8 and the short-circuiting circuit 9 are operated complementary to each other.

For example, when the voltage supplied to a stage which requires a small voltage, such as a voltage amplifier stage, becomes zero, the direct voltage detector 2 of the first protection circuit does not operate. However, the supply voltage monitoring circuit 8 of the second protection circuit detects the abnormality, thus cutting off the power. Therefore the present embodiment provides a reliable protection circuit.

The present embodiment may be modified so as to feed an abnormality signal $V_{D5}$ from the failure detecting section 4 to the short-circuiting circuit 9 as shown by a dashed line. The abnormality signal $V_{D5}$ is further applied to a short-circuiting circuit 9 of a protection circuit for the other channel of the stereo system. Hence, even if a failure in one channel prevents the through current Is to flow, protection circuit in the other channel is operative, enabling to cut off the power.

From the foregoing it will be understood that the present invention provides a protection circuit for a power amplifier where the number of relays and fuses are reduced. Hence the number of parts are reduced, thereby enabling to simplify the device and to reduce the size thereof, and reducing the manufacturing cost.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A protection circuit for a power amplifier comprising:
   direct current voltage detecting circuit means for monitoring output voltage of the power amplifier and for producing a detecting signal when a direct current voltage is detected;
   cutoff circuit means responsive to the detecting signal for rendering an output stage of the power amplifier a cutoff state;
   failure determining circuit means responsive to the detecting signal for producing an abnormality signal when the detecting signal continues for a predetermined time after the cutting off of the output stage; and
   a power supply cutoff circuit responsive to the abnormality signal for cutting off a power supply of the power amplifier.

2. A protection circuit for a power amplifier comprising:
   supply voltage monitoring circuit means for monitoring supply voltage of at least one stage precedent to an output stage of the power amplifier and for producing an abnormality signal when the supply voltage is abnormal;
   a short-circuiting circuit responsive to the abnormality signal for short-circuiting between both sides of a circuit in the power amplifier so as to cause a large current in a power supply of the power amplifier, and
   a power supply cutoff circuit for cutting off the power supply by said large current.

3. The circuit according to claim 2 wherein the power supply cutoff circuit is provided at a primary side of the power supply.

4. The circuit according to claim 2 wherein the power supply cutoff circuit includes a fuse.

5. The circuit according to claim 2 wherein the short-circuiting circuit includes a circuit for forcibly turning on elements between both the sides of the circuit.

6. The circuit according to claim 2 wherein the supply voltage monitoring circuit means produces the abnormality signal when the supply voltage becomes zero.

7. A protection circuit for a power amplifier comprising:
   direct current voltage detecting circuit means for monitoring output voltage of the power amplifier and for producing a detecting signal when a direct current voltage is detected;
   cutoff circuit means responsive to the detecting signal for rendering an output stage of the power amplifier a cutoff state;
   failure determining circuit means responsive to the detecting signal for producing a first abnormality signal;
   a power supply cutoff circuit responsive to the first abnormality signal for cutting off a power supply of the power amplifier;
   supply voltage monitoring circuit means for monitoring supply voltage of at least one stage precedent to a stage of the power amplifier and for producing a second abnormality signal when the supply voltage is abnormal;
   a short-circuiting circuit responsive to the second abnormality signal for short-circuiting between both sides of a circuit of the power amplifier so as to cause a large current in the power supply; and
   said power supply cutoff circuit being provided for cutting off the power supply by said large current.

8. A method for protecting a power amplifier comprising:
   monitoring output voltage of the power amplifier;
   producing a detecting signal when a direct current voltage is detected in the output voltage;
   rendering an output stage of the power amplifier a cutoff stage in response to the detecting signal;
   producing an abnormality signal in response to the detecting signal; and
   cutting off a power supply of the power amplifier in response to the abnormality signal.

9. A method for protecting a power amplifier comprising:
   monitoring supply voltage of at least one stage precedent to an output stage of the power amplifier;
   producing an abnormality signal when the supply voltage is abnormal;
   short-circuiting between both sides of a circuit of the power amplifier in response to the abnormality signal so as to cause a large current in a power supply of the power amplifier; and
   cutting off the power supply by said large current.

10. A method for protecting a power amplifier comprising:
    monitoring output voltage of the power amplifier;
    producing a detecting signal when a direct current voltage is detected in the output voltage;
    rendering an output stage of the power amplifier a cutoff state in response to the detecting signal;
    producing a first abnormality signal in response to the detecting signal;
    cutting off a power supply of the power amplifier in response to the first abnormality signal;
    monitoring supply voltage of at least one stage precedent to an output stage of the power amplifier;
    producing a second abnormality signal when the supply voltage is abnormal;
    short-circuiting between both sides of a circuit of the power amplifier in response to the second abnormality signal so as to cause a large current in a power supply of the power amplifier; and
    cutting off the power supply by said large current.

* * * * *